United States Patent [19]

Leowald et al.

[11] 4,084,206

[45] Apr. 11, 1978

[54] PROTECTION CIRCUIT FOR SERIALLY CONNECTED THYRISTORS

[75] Inventors: Karl-Friedrich Leowald, Weiher near Erlangen; Jakob Schenk, Erlangen, both of Germany

[73] Assignee: Siemens Aktiengesellschaft, Munich, Germany

[21] Appl. No.: 747,320

[22] Filed: Dec. 2, 1976

[30] Foreign Application Priority Data

Aug. 23, 1976 Germany .............................. 2637868

[51] Int. Cl.$^2$ ............................................. H02H 7/10
[52] U.S. Cl. .................................. 361/90; 307/252 L; 363/54; 363/57
[58] Field of Search ...................... 361/90, 88, 91, 100, 361/86; 363/50, 54, 57; 307/252 L

[56] References Cited

U.S. PATENT DOCUMENTS

| 3,842,337 | 10/1974 | Ekstrom et al. ............. 307/252 L X |
| 3,865,438 | 2/1975 | Boksjo et al. ......................... 363/54 |
| 3,878,448 | 4/1975 | Jackson et al. .............. 307/252 L X |
| 3,881,147 | 4/1975 | Ueda et al. ............................. 363/57 |

*Primary Examiner*—J D Miller
*Assistant Examiner*—Patrick R. Salce
*Attorney, Agent, or Firm*—Kenyon & Kenyon, Reilly, Carr & Chapin

[57] ABSTRACT

A protection circuit for protecting the thyristors of a series circuit of several thyristors, each of which has a corresponding firing circuit to which its anode-cathode voltage is applied. The protection circuit comprises: a plurality of first monitoring means, each of which first monitoring means is associated with and at the potential of a different one of said thyristors, and each of which monitoring means generates a first switching signal when either the current carried by its associated thyristor becomes zero or the voltage across its respective thyristor falls below a predetermined negative value; a plurality of first potential-separating transmission means, each of which first transmission means transmits a different one of said first switching signals; an evaluating means; a plurality of second, potential separating transmission means; a plurality of second monitoring means, each of which second monitoring means is associated with and at the potential of a different one of said thyristors, and each of which second monitoring means generates a second switching signal when the voltage across its associated thyristor exceeds a predetermined positive value; and a plurality of logic circuit means each of which is adapted to feed a signal to the firing circuit associated with a different one of said thyristors when the second switching signal generated by the second monitoring means associated with that one thyristor appears during the timing signal transmitted by the second transmission means associated with that one thyristor.

6 Claims, 3 Drawing Figures

PROTECTION CIRCUIT FOR SERIALLY CONNECTED THYRISTORS

BACKGROUND OF THE INVENTION

1. Field of the Invention

The invention relates to a protection circuit for protecting the thyristors (SCR'S) of a series circuit of several thyristors, and, in particular, thyristors each of which has a corresponding firing circuit to which its anode-cathode voltage is applied.

2. Description of the Prior Art

Such a protection circuit for serial connection of thyristors forming a valve is known from the German Auslegeschrift DT-AS No. 20 05 724. The aforesaid known protection circuit comprises an arrangement wherein the polarity of the voltage across the valve is sensed and a first signal is delivered via a multivibrator circuit to an AND gate for a predetermined monitoring period corresponding to the maximum recovery time of the thyristors, if the polarity of the voltage, after a commutation, becomes negative, and a second signal is delivered directly to such AND gate if the polarity of the voltage becomes positive. Thus, a firing signal is delivered to all thyristors of the valve via the AND gate only if the second signal is delivered within the predetermined monitoring time period.

In the aforesaid known protection circuit, the entire series circuit of thyristors is monitored by employing a voltage divider to derive a signal related to the polarity of the total voltage present across the series-connected thyristors. In such an overall monitoring system, the different properties of the individual thyristors are not taken into account, as the voltage waveform across the entire series circuit is not an indication of the voltage waveforms at the individual thyristors. However, because of the differing properties of the thyristors, the voltage waveforms at the individual thyristors can be different from each other and from the total voltage across their series connection. Thus, it is conceivable, that the individual voltage waveforms may equalize one another so that the total voltage monitored by the protection circuit indicates protective measures need not be taken, while, in fact, one of the thyristors may be in danger of being overstressed. It is a further disadvantage of the aforesaid known protection circuit that in the event of a disturbance, all of the respective thyristors in the series circuit are fired. This requires an unnecessarily large amount of firing power, which must be derived from the anode-cathode voltage of the respective thyristors.

It is therefore an object of the present invention to provide a protection circuit arrangement for protecting the thyristors in a series circuit of several thyristors which takes the properties of each individual thyristor into account and which during operation is insulated against interference.

SUMMARY OF THE INVENTION

In accordance with the principles of the present invention, the above and other objectives are accomplished in a protection circuit arrangement which includes the following:

a plurality of first monitoring means, each of which first monitoring means is associated with and at the potential of a different one of said thyristors, each of which monitoring means generates a first switching signal when either the current carried by its associated thyristor becomes zero or the voltage across its respective thyristor falls below a predetermined negative value;

a plurality of first potential-separating transmission means, each of which first transmission means transmits a different one of said first switching signals;

an evaluating means at ground potential responsive to said transmitted first switching signals for generating at least one timing signal of duration corresponding to a predetermined monitoring period;

a plurality of second, potential separating transmission means, each of which second transmission means is associated with a different one of said thyristors and each of which second transmission means transmits a timing signal;

a plurality of second monitoring means, each of which second monitoring means is associated with and at the potential of a different one of said thyristors, and each of which second monitoring means generates a second switching signal when the voltage across its associated thyristor exceeds a predetermined positive value; and a plurality of logic circuit means each of which is adapted to feed a signal to the firing circuit associated with a different one of said thyristors when the second switching signal generated by the second monitoring means associated with that one thyristor appears during the timing signal transmitted by the second transmission means associated with that one thyristor.

The aforesaid timing signal which is generated by the evaluating means of the present protection circuit may be derived from a continuous signal which is present for the duration of the monitoring period. However, it is also possible to form the timing signal by feeding pulses which are situated at the beginning and the end of the monitoring period to a multivibrator (flip flop). The signal may also be formed by coded signals for identifying the beginning and the end of the monitoring period. It is further possible to form the timing signal from a pulse which is situated at the beginning of the monitoring period and is fed to a timing stage having a delay which extends the duration of the pulse to a period corresponding to the monitoring period.

The monitoring period may itself be selected so as to correspond to the protection time of a respective thyristor. The protection time is understood here to be a minimum time, during which the anode current of a thyristor is lowered below the value of the holding current. The protection time is, therefore, somewhat longer than the thyristor recovery time. Only at the end of the protection time can a thyristor, therefore, be stressed again with a positive voltage.

The monitoring period may also be selected to correspond to the theoretical current conduction period of a thyristor. The latter period is understood here to be the angle between the beginning of the current conduction of two valve branches following each other in the commutating process. The current conduction period is obtained from the frequency and the number of pulses of the converter, taking the overlap angle into account.

In the protection circuit according to the invention, each individual thyristor in a series circuit of thyristors is monitored separately. As a result, thyristors with different recovery times can be connected in series, as the protection circuit now takes the differing properties of the thyristors into consideration. Thus, only those thyristors are fired which are in danger with respect to unpermissible self-firing, thereby saving firing power.

Moreover, by providing monitoring means which are at the thyristor potential and an evaluating means which is at ground potential, and by connecting the latter monitoring and evaluating means via potential-separating means, insulation against interference is significantly improved.

In one embodiment of the invention, the evaluation means comprises a plurality of evaluation devices each of which is responsive to a different one of the generated first switching signals. In this embodiment, moreover, each evaluation device generates a timing signal and each timing signal is transmitted by the second transmission means associated with the thyristor whose corresponding first switching signal was employed to generate the timing signal.

In a second embodiment of the invention having improved insulation to interference, a common timing signal is formed by the evaluating means and transmitted by all the second transmission means. In this embodiment the evaluation means comprises a counting means which is responsive to the first switching signals and which generates a release signal for a release unit only if a predetermined number of first switching signals has arrived or been counted. The release unit, in turn, feeds an evaluating device whose output forms the common timing signal which is coupled to all second transmission devices for transmission to the respective logic circuit means.

The aforesaid second embodiment of the invention is directed to the situation where the protection circuit must provide protection for a large number of series-connected thyristors, say, for example, 100 or more thyristors. In such case, the first switching signals which are generated when the current in their respective thyristors becomes zero or when the voltage across their respective thyristors falls below a predetermined negative value, do not appear simultaneously, but rather with an unavoidable spread in time of the order of several microseconds. Also, there is the further possibility that no first switching signal appears at the transmitter-side output of one of the first transmission devices, either because no negative voltage is present at the respective thyristor or because a defect has occurred in the associated first monitoring device or in the first transmission device.

To avoid misfirings, the first switching signals are, therefore, fed into the release unit and combined therein to form a common first switching signal which is fed to the common evaluating device. The first switching signals are also fed to the counting device for a statistical evaluation of the number of received first switching signals. Only when a predetermined number of first switching signals has been counted, for instance, only when 80% of all possible switching signals have been counted, does the counting device release the release unit, which in turn, addresses the evaluation unit with the common first switching signal. The evaluating device, in turn, generates for the monitoring period, the common timing signal which is transmitted to the individual logic circuit means via the second, potential-separating transmission means.

The aforesaid embodiment of the invention has a high operating reliability, as trouble at one or several thyristors or at the first monitoring means following them and at the first transmission means does not lead to incorrect timing signals. Thus, misfiring of the thyristors and unnecessary consumption of firing energy are avoided.

In a further aspect of the invention, each of the logic circuit means comprises a conjunctive (AND) logic member for receiving its respective timing signal and its respective second switching signal and, in addition, a monostable multivibrator having a delay corresponding to the desired duration of the firing pulses. With the logic means so constructed a further saving of firing energy is realized.

BRIEF DESCRIPTION OF THE DRAWINGS

The above and other features and aspects of the present invention will become more apparent upon reading the following detailed description in conjunction with the accompanying drawings in which.

DETAILED DESCRIPTION

Figure 1:
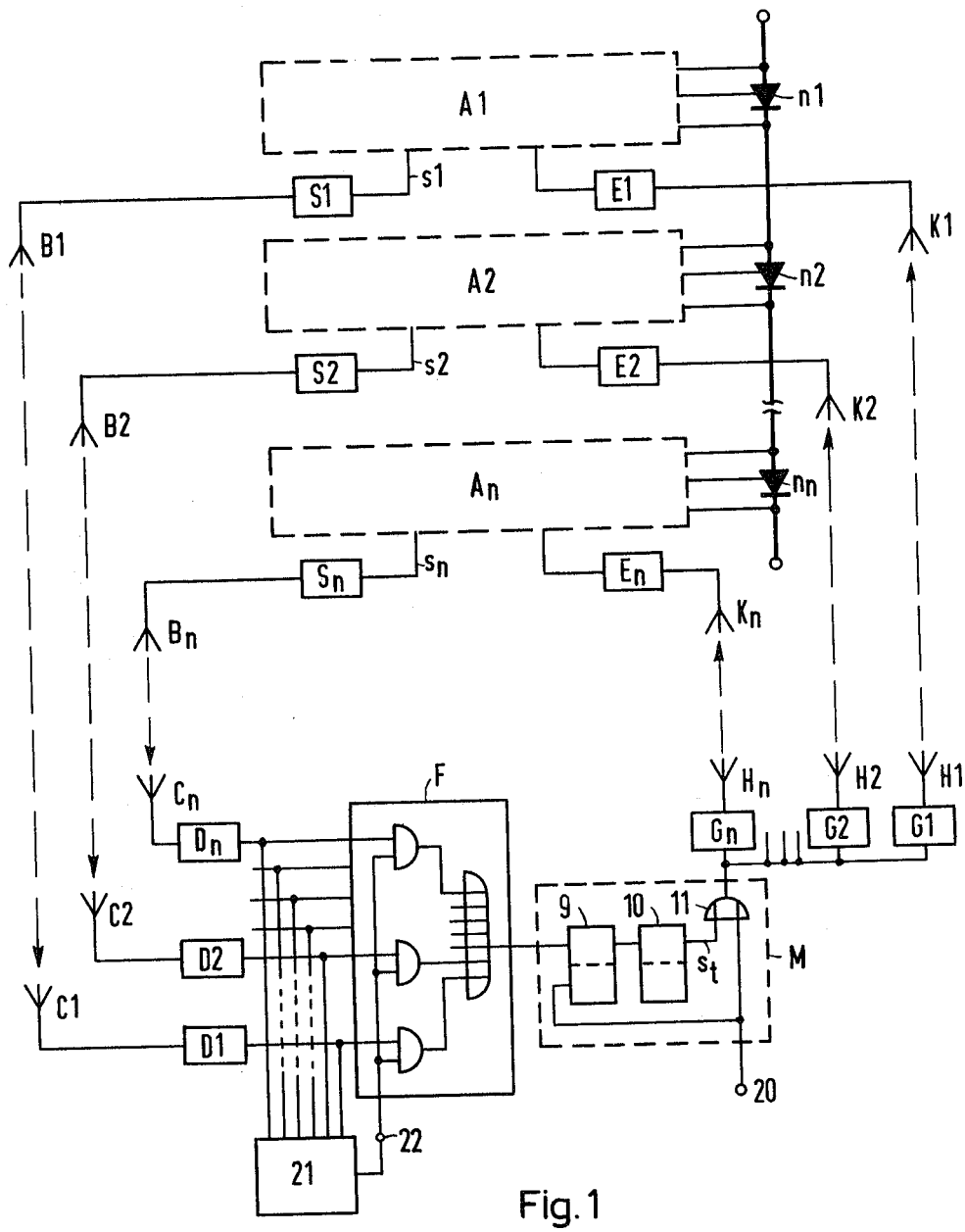
FIG. 1 shows a protection circuit arrangement in accordance with the principles of the present invention.

FIG. 1 shows a protection circuit in accordance with the invention for protecting a plurality of serially connected thyristors $n1, n2, \ldots n_n$. Typically, the aforesaid serially connected thyristors may number 100 or more. The protection circuit comprises a plurality of correspondingly similarly configured circuit arrangements $A1, A2, \ldots A_n$, each of which circuit arrangements is associated with and serves to protect a different one of the serially connected thyristors $n1, n2 \ldots n_n$. As above noted, the design of each of the circuit arrangements $A1$ to $A_n$ is similar and will be explained with reference to FIG. 2 which shows the details of the circuit arrangement $A1$.

Figure 2:
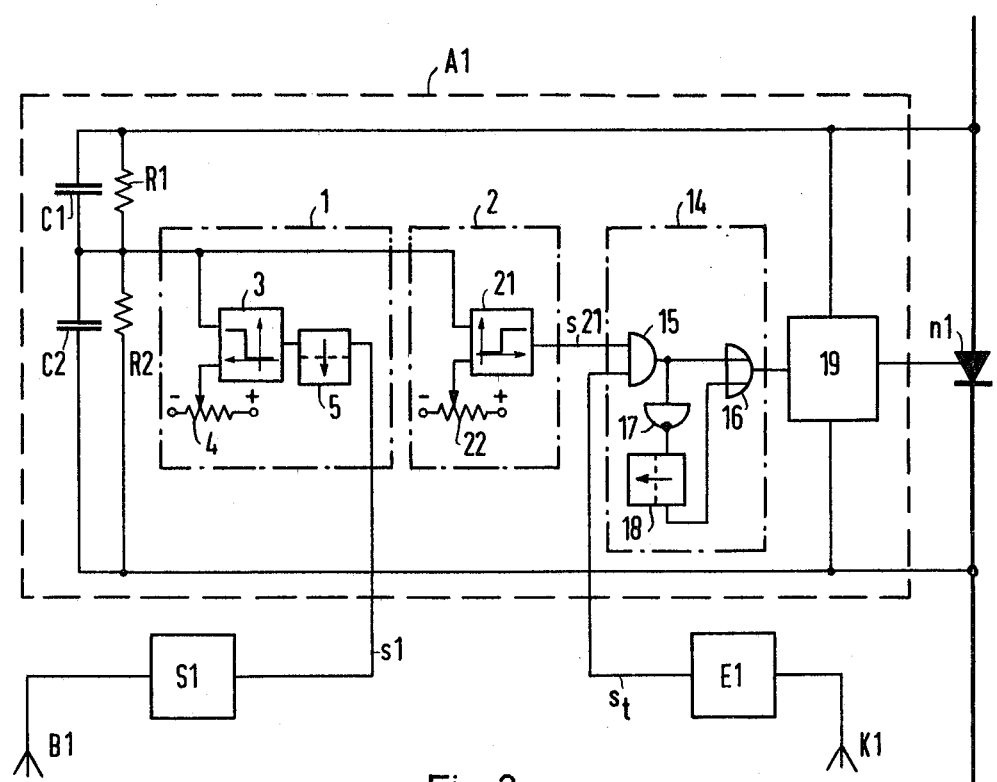
FIG. 2 shows in detail the configuration of a component circuit associated with each thyristor shown in the arrangement of FIG. 1.

As shown schematically in FIG. 2, the circuit arrangement $A1$ comprises a firing circuit 19 which is energized via the anode-cathode voltage of the respective thyristor $n1$. The firing circuit 19 may be constructed, for example, as described in the German Pat. No. 15 38 099. The circuit arrangement $A1$ also includes a first monitoring device 1 which is at the thyristor potential and which has its input connected to a voltage divider circuit R1, C1; R2, C2; the latter circuit being fed by the anode-cathode voltage across the thyristor $n1$. The monitoring device 1 includes a limit indicator 3 which may, e.g., be a multivibrator, and which compares the anode-cathode voltage appearing at the voltage divider output with a predetermined negative value. The latter value is symbolically shown in FIG. 2 as a voltage tapped off at a potentiometer 4.

The limit indicator 3 is constructed to change its output signal if the anode-cathode voltage across the thyristor $n1$ falls below the predetermined negative value. This change in the output signal of the limit indicator 3 is used to trigger a monostable multivibrator (flip flop) 5 with a short time duration pulse of, for example, 10 usec. The output signal of the multivibrator represents a first switching signal $s1$ indicating the beginning of the protection time of the thyristor $n1$. The first switching signal $s1$ can also be obtained by monitoring the load current of the thyristor $n1$ with a current measuring transformer and by coupling the monitored current to a limit indicator which changes its output signal if the current in the thyristor $n1$ becomes zero.

As may further be seen from FIG. 1, the first switching signals $s1, s2, \ldots s_n$ associated with the thyristors $n1$, $n2 \ldots n_n$ and formed in the circuit arrangements A1, A2, $\ldots$ A$_n$ are transmitted to ground potential via respective first, potential-separating transmission devices. The aforesaid devices comprise, on the transmitter side, the respective transmitters S1, S2, $\ldots$ S$_n$ followed by the transmitting antennas B1, B2, $\ldots$ B$_n$ and on the receiver side, the respective receivers D1, D2, $\ldots$ D$_n$ followed by the receiving antennas C1, C2, $\ldots$ C$_n$. The transmitted first switching signals appear at the outputs of the receivers D1, D2, $\ldots$ D$_n$ and are fed to the input of a release unit F. The release unit F passes the first switching signals fed to its input only if a release signal is present at its control input 22. As shown, the release unit F typically may comprise a number of inhibit gates, each having one of its inputs connected to the output of one of the receivers D1, D2, $\ldots$ D$_n$ and the other of its inputs connected to the common control input 22. The outputs of these inhibit gates are followed by a disjunctive (OR) logic gate whose output forms the output of the release unit.

The transmitted first switching signals $s1, s2, \ldots s_n$ are also fed to a counting device 21 which, as shown, may be constructed as a counter having parallel inputs. If a predetermined number of transmitted first switching signals, for example, if in the case of a series circuit of 100 thyristors, 80 transmitted first switching signals, have arrived at the counting device 21, the device 21 generates at its output a release signal which is fed to the release unit F via its control input 22. In response thereto, the release unit F is switched into conduction and addresses an evaluating device M at ground potential.

The evaluating device M comprises a bistable multivibrator 9 followed by a monostable multivibrator 10 whose output is coupled to an OR gate 11. The output signal of the release stage F sets the bistable multivibrator 9, which, in turn, triggers the monostable multivibrator 10. The pulse length of the timing signal $s_t$ of the monostable multivibrator 10 corresponds to a monitoring period which at least as long as either the protection time of the thyristors used or their theoretical current conduction period.

The multivibrator 9 is reset by a firing control signal of a control unit (not shown). This firing control signal is fed to the evaluating device M at the terminal 20. The firing control signal at the terminal 20 and the timing signal $s_t$ of the monostable multivibrator 10 are combined in the OR gate 11, and the output of the OR gate is coupled to a number of second, potential separating transmission devices for transmission thereby. The second transmission devices comprise on the transmitter side the respective transmitters G1, G2, $\ldots$ G$_n$ followed by transmitting antennas H1, H2, $\ldots$ H$_n$ and on the receiver side, respective receivers E1, E2, $\ldots$ E$_n$ preceded by receiving antennas K1, K2, $\ldots$ K$_n$. As is evident, the second, potential-separating transmission devices also serve to transmit the firing signals of the control unit. No further transmission devices need, therefore, be provided for the protection circuit according to the invention.

As may again be seen from FIG. 2, the circuit arrangement A1 further includes a second monitoring device 2 which is at the thyristor potential and which likewise is fed the output of the voltage divider R1, C1; R2, C2. This second monitoring device 2 includes a limit indicator 21 which may, for example, also be a multivibrator, and which compares the voltage across the thyristor $n1$ as derived from the voltage divider with a predetermined positive voltage value. The latter voltage value is schematically illustrated as a voltage tapped off at a potentiometer 22. If the predetermined positive voltage value is exceeded, the second monitoring device 2 generates a second switching signal $s21$. The second switching signal $s21$ and the common timing signal $s_t$ received by the receiver E1 are fed to a logic circuit 14 and interlinked there conjunctively in an AND gate 15. The logic circuit 14, therefore, provides a signal to the firing circuit 19 for causing the latter to deliver firing pulses to the control path of the thyristor $n1$, if the second signal $s21$ from the second monitoring device 2 appears during the duration of the common timing signal $s_t$.

The duration of a firing pulse fed to a thyristor depends upon the special requirements of the thyristor. To keep the required firing power low, the firing pulse can be terminated after a brief period of time, say, for example, a period of a few microseconds. For this purpose, in the arrangement of FIG. 1, the output signal of the AND gate 15 is fed via an inverter stage 17 to monostable multivibrator 18 having a correspondingly short pulse length, and the output signal of which is disjunctively interlinked with the output signal of the AND gate 15 in an OR gate 16. The OR gate 16 is thus cut off at the end of the pulse of the monostable multivibrator 18 and the filing pulse is thereby terminated.

It should be pointed out that the potential-separating transmission devices may, advantageously, comprise optoelectronic transmitters and receivers.

Figure 3:
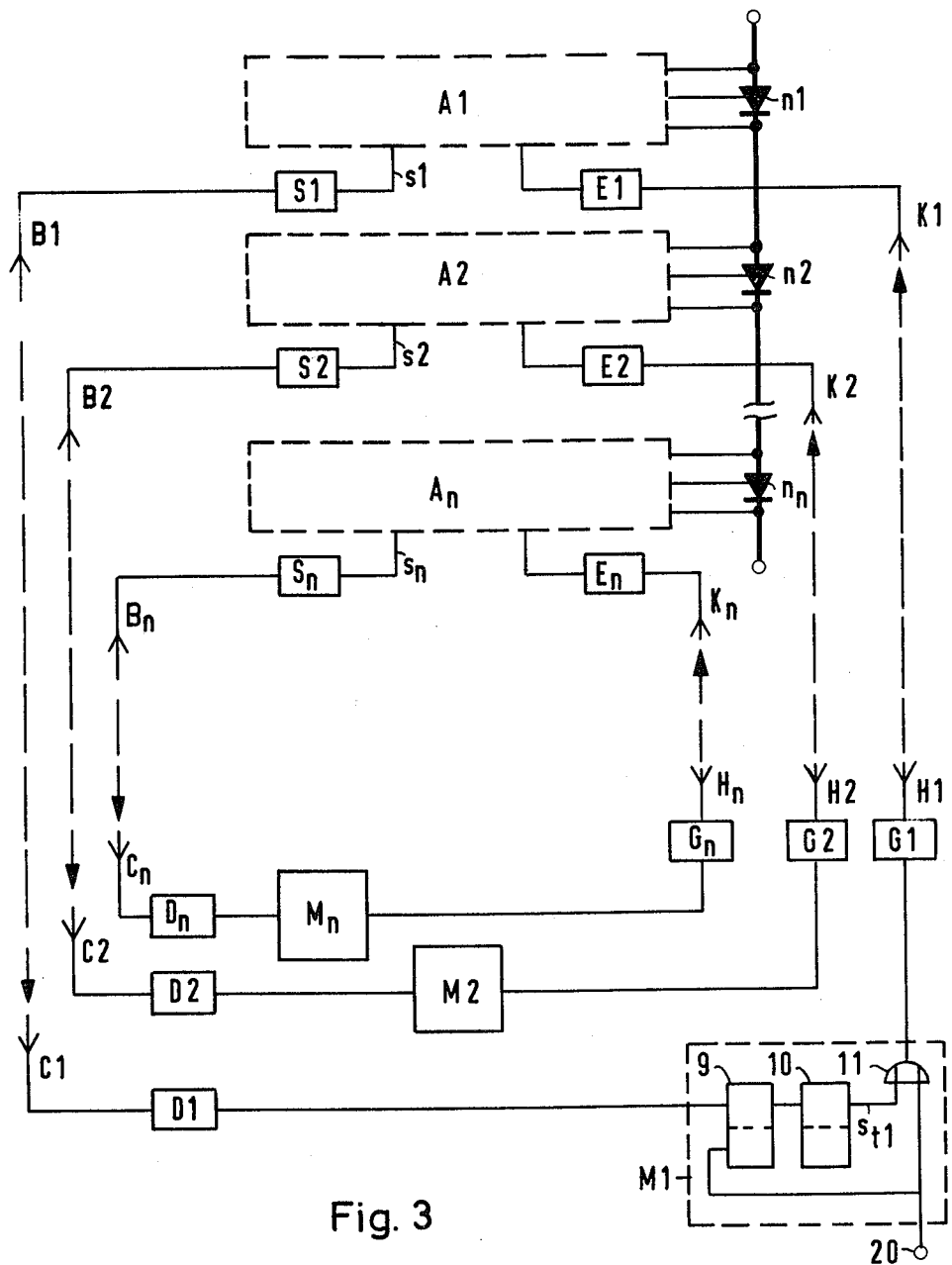
FIG. 3 shows a modification of the circuit arrangement of FIG. 1.

FIG. 3 shows a modification of the protection circuit of FIG. 1 in which similarly constructed evaluating devices M1, M2, $\ldots$ M$_n$ are associated with the serially connected thyristors $n1, n2, \ldots n_n$. The evaluating devices M1, M2, $\ldots$ M$_n$ are at ground potential and are situated between the receivers D1, D2, $\ldots$ D$_n$ of the first, potential-separating transmission devices and the transmitters G1, G2, $\ldots$ G$_n$ of the second potential-separating transmission devices. The construction of the evaluating devices will be described making reference to the specific evaluating device M1.

The evaluating device M1 comprises a bistable multivibrator 9 followed by a monostable multivibrator 10 whose output is connected to an OR gate 11. The first switching signal $s1$, transmitted via the potential-separating transmission device comprising the transmitter S1, the transmitting antenna B1, the receiving antenna C1 and the receiver D1, sets the bistable multivibrator 9, which, in turn, triggers the monostable multivibrator 10. The pulse length of the timing signal $s_{t1}$ of the monostable multivibrator 10 corresponds to at least the protection time of the thyristor $n1$ or to its theoretical current conduction time. The latter signal $s_{t1}$ represents the timing signal for the thyristor $n1$ and is transmitted to the circuit arrangement A1 via the potential-separating transmission device comprising the transmitter G1, the transmitting antenna H1, the receiving antenna K1 and the receiver E1.

What is claimed is:
1. A protection circuit arrangement for protecting each of a plurality of thyristors, said thyristors being connected in series and each having associated therewith a firing circuit which is energized via the anode-cathode voltage of its respective thyristor, said protection circuit comprising:
   a plurality of first monitoring means, each of which first monitoring means is associated with and at the potential of a different one of said thyristors, and each of which first monitoring means generates a first switching signal when one of a first and second condition occurs, said first condition being when the current carried by the thyristor associated with that first monitoring means becomes zero and the second condition being when the voltage across the thyristor associated with that first monitoring means falls below a predetermined negative value;

a plurality of first potential-separating transmission means, each of which first transmission means transmits a different one of said first switching signals;

an evaluating means responsive to said transmitted first switching signals for generating at least one timing signal of duration corresponding to a predetermined monitoring period, said evaluating means being at ground potential;

a plurality of second, potential separating transmission means, each of which second transmission means is associated with a different one of said thyristors and each of which second transmission means transmits a timing signal;

a plurality of second monitoring means, each of which second monitoring means is associated with and at the potential of a different one of said thyristors and each of which monitoring means generates a second switching signal when the voltage across its associated thyristor exceeds a predetermined positive value;

a plurality of logic circuit means each of which is adapted to feed a signal to the firing circuit associated with a different one of said thyristors when the second switching signal generated by the second monitoring means associated with that one thyristor appears during the timing signal transmitted by the second transmission means associated with that one thyristor.

2. A protection circuit in accordance with claim 1 in which:
each of said second transmission means transmits said one timing signal.

3. A protection circuit in accordance with claim 1 in which said evaluating means comprises:
a counting means responsive to said first switching signals for generating a release signal when a predetermined number of said first switching signals have been received;
a release unit responsive to said first switching signals and to said release signal;
and a common evaluation device responsive to the output of said release unit for providing a common timing signal in the form of said one timing signal.

4. A protection circuit in accordance with claim 1 wherein:
said evaluation means comprises a number of evaluation devices, each of which is responsive to a different one of said first switching signals and each of which generates a timing signal;
and each one of said second transmission means transmits the timing signal generated in response to the first switching signal derived from the first monitoring means associated with the thyristor to which that one second transmission means is associated.

5. A protection circuit in accordance with claim 1 in which each of said logic circuit means includes:
a conjunctive (AND) logic member for receiving a timing signal and a second switching signal;
and a monostable multivibrator with a delay corresponding to a desired firing pulse length.

6. A protection arrangement in accordance with claim 1 wherein:
the number of first monitoring means, first transmission means, second transmission means, second monitoring means and logic circuit means is equal to the number of thyristors.

* * * * *